US011233476B2

(12) United States Patent
Verheyen et al.

(10) Patent No.: US 11,233,476 B2
(45) Date of Patent: Jan. 25, 2022

(54) METHOD AND APPARATUS FOR LOW DC BUS VOLTAGE RIDE THROUGH

(71) Applicant: Magnetek, Inc., Menomonee Falls, WI (US)

(72) Inventors: Kurtis L. Verheyen, Glendale, WI (US); Jacob C. Lester, Glade Spring, VA (US)

(73) Assignee: Magnetek, Inc., Menomonee Falls, WI (US)

( * ) Notice: Subject to any disclaimer, the term of this patent is extended or adjusted under 35 U.S.C. 154(b) by 55 days.

(21) Appl. No.: 16/825,564

(22) Filed: Mar. 20, 2020

(65) Prior Publication Data

US 2021/0297028 A1    Sep. 23, 2021

(51) Int. Cl.
| | | |
|---|---|---|
| *H02P 27/06* | (2006.01) | |
| *H02P 27/04* | (2016.01) | |
| *B66D 3/20* | (2006.01) | |
| *H02P 6/08* | (2016.01) | |
| *G01R 19/165* | (2006.01) | |
| *H02P 23/14* | (2006.01) | |

(52) U.S. Cl.
CPC ............... *H02P 27/06* (2013.01); *B66D 3/20* (2013.01); *G01R 19/16528* (2013.01); *H02P 6/08* (2013.01); *H02P 23/14* (2013.01); *H02P 27/047* (2013.01)

(58) Field of Classification Search
CPC .................................. H02P 27/06; H02P 6/08
USPC ............................... 318/400.26, 400.01, 700
See application file for complete search history.

(56) References Cited

U.S. PATENT DOCUMENTS

| | | | | |
|---|---|---|---|---|
| 5,600,221 | A | * | 2/1997 | Tomatsuri ............ G05B 19/237 318/632 |
| 5,703,459 | A | | 12/1997 | Yasohara et al. |
| 6,654,261 | B2 | | 11/2003 | Welches et al. |

(Continued)

FOREIGN PATENT DOCUMENTS

JP       2004282911 A    10/2004

OTHER PUBLICATIONS

Collins et al.; Effects of Voltage Sags on AC Motor Drives; Conference Paper Jun. 1997; https://www.researchgate.net/publication/3695886—(5) pages.

(Continued)

*Primary Examiner* — David Luo
(74) *Attorney, Agent, or Firm* — Boyle Fredrickson, SC

(57) ABSTRACT

A method and system to prevent unexpected operation of a motor when the voltage level on a DC bus drops is disclosed. The voltage level on the DC bus is monitored during a run command. When a run is commanded, the processor executes a control routine to determine a desired amplitude and frequency for the output voltage required to control the motor connected to the motor drive. If the desired frequency of the output voltage exceeds a maximum frequency for the measured voltage on the DC bus, as established by parameters stored in the motor drive, the motor drive limits the output frequency to the maximum frequency for the corresponding measured voltage. The motor drive continually monitors the measured voltage present on the DC bus and further reduces the maximum output frequency allowed during the run if the present value of the measured voltage drops below a previously measured value.

16 Claims, 5 Drawing Sheets

(56) References Cited

U.S. PATENT DOCUMENTS

| | | |
|---|---|---|
| 7,425,806 B2 | 9/2008 | Schnetzka et al. |
| 7,834,579 B2 | 11/2010 | Nojima |
| 8,125,173 B2 * | 2/2012 | Terashima .............. B66C 13/22 |
| | | 318/650 |
| 8,274,803 B2 | 9/2012 | Swamy et al. |
| 8,456,128 B2 | 6/2013 | Fotherby |
| 9,647,597 B2 | 5/2017 | Matsuda et al. |
| 9,667,178 B2 | 5/2017 | Liu et al. |
| 10,020,766 B2 | 7/2018 | Royak et al. |
| 2003/0142963 A1 | 7/2003 | Nadeau |
| 2005/0278130 A1 | 12/2005 | McNutt |
| 2007/0137945 A1 | 6/2007 | Takasaki et al. |

OTHER PUBLICATIONS

Aspalli et al.; Speed Control of Three Phase Induction Motor by VVVF method using G7/A-1000 Drive; International Journal of Recent Technology and Engineering (IJRTE) ISSN: 2277-3878, vol. 3 Issue—4, Sep. 2014—(7) pages.

International Search Report dated Jul. 9, 2021; International Application No. PCT/US2021/023192—(4) pages.

* cited by examiner

METHOD AND APPARATUS FOR LOW DC BUS VOLTAGE RIDE THROUGH

BACKGROUND OF THE INVENTION

The subject matter disclosed herein relates to a system for continuing operation of a motor drive while maintaining control of a motor connected to the motor drive when the voltage present on the DC bus decreases. More specifically, the motor drive is configured to automatically limit a maximum frequency of an output voltage generated by the motor drive as a result of detecting the decreased DC bus voltage.

Material handling systems are widely used to lift heavy loads. A typical material handling system includes at least one motor used to raise and lower the load. The material handling system may also include at least one additional motor to position the material handling system over the load to be moved. Optionally, the material handling system may be mounted in a fixed location or to a rail where the operator may manually slide the system along the rail. Common applications include manufacturing facilities, in which components that are too large for an individual to lift may be raised, lowered, and/or positioned for assembly. Similarly, the fully assembled product may be raised, lowered, or moved for shipping.

In some material handling systems, the motor may include a motor drive configured to control operation of the motor used to raise and lower the load. The motor drive generates an alternating current (AC) output voltage having a variable amplitude and variable frequency, where the amplitude and frequency are selected to achieve desired operation of the motor. The motor drive may further include a direct current (DC) bus on which a DC voltage is present. The DC voltage is provided as an input to an inverter section, and the inverter section is operated to generate the variable amplitude and variable frequency output voltage. The DC voltage may be supplied directly from an external DC power source or the motor drive may include a power converter to step up or step down the DC voltage from a first voltage at the input to a desired DC voltage on the DC bus. Optionally, the DC voltage may be supplied by AC power source. The motor drive may include a rectifier section to convert an AC voltage at the input to the DC voltage present on the DC bus.

It is known that AC motors are configured to operate with a magnetic field having a generally constant strength, and the magnetic field within a motor is proportional to a ratio between an amplitude and a frequency of the AC voltage generated by the motor drive and supplied to the motor. In order, therefore, to maintain this generally constant magnetic field, the amplitude of the voltage output to the motor should change in coordination with the frequency of the voltage being output to the motor. If the amplitude of voltage is too high for the desired frequency of the motor, the magnetic field increases beyond what is necessary to control operation of the motor, and the excess magnetic field causes heating in the motor. If the amplitude of the voltage is too low for the desired frequency of the motor, the magnetic field decreases, resulting in a reduced magnetic flux within the motor and a lower capacity for torque production by the motor.

In certain applications, the material handling system may be connected to a soft power source, meaning the power source may be susceptible to fluctuation in the voltage and/or current the power source is able to provide to the motor drive. The soft power source may be, for example, a generator where the output capacity of the generator is limited. While the generator may be primarily used as a backup power supply, when it is in use, the total load connected to the generator may exceed the capacity of the generator, causing the voltage output by the generator to decrease. When the voltage provided to the motor drive decreases, the voltage on the DC bus similarly decreases and the voltage that the motor drive is capable of supplying to the motor similarly decreases. If the frequency of the voltage output to the motor remains the same, the amplitude of voltage the drive is able to output is too low for the desired frequency and the magnetic field in the motor also begins to decrease.

Connection of the material handling system to a soft power source may result in a potentially hazardous operating condition. If the material handling system is raising or lowering a load close or equal to the rated capacity and rated speed of the material handling system when the voltage decreases, the magnetic field may no longer be sufficient to produce the torque required by the motor to maintain control of the load. Under such a condition, the load may begin to overhaul the motor and begin to lower either unexpectedly, if the motor was raising the load, or at a greater than unexpected rate, if the motor was lowering the load.

Thus, it would be desirable to provide a system to prevent unexpected operation of the motor when the voltage level on the DC bus droops to such a degree that the motor drive is unable to provide an AC output voltage at a voltage and frequency required to maintain control of a load present on the motor.

BRIEF DESCRIPTION OF THE INVENTION

The subject matter disclosed herein describes a method and system to prevent unexpected operation of the motor when the voltage level on the DC bus droops to such a degree that the motor drive is unable to provide an AC output voltage at a voltage and frequency required to maintain control of a load present on the motor. The level of voltage present on the DC bus is measured and provided as an input to a processor executing in the motor drive. When a run is commanded, the processor executes a control routine to determine a desired amplitude and frequency for the output voltage required to control the motor connected to the motor drive and to achieve operation of the motor at a commanded speed. The processor also monitors the level of voltage present on the DC bus and compares the measured voltage to predefined settings stored in the motor drive, where the predefined settings establish a maximum frequency at which the motor drive is to operate over a range of measured voltage levels. If the desired frequency of the output voltage exceeds the maximum frequency as established by the predefined settings and which corresponds to the measured voltage present on the DC bus, the motor drive limits the output frequency to the maximum frequency for the corresponding measured voltage present on the DC bus. The motor drive continually monitors the measured voltage present on the DC bus and continues to reduce the maximum output frequency allowed during the run if the present value of the measured voltage drops below a previously measured value. By limiting the maximum frequency of voltage that may be output from the motor drive, the motor drive attempts to operate at a frequency that corresponds to the correct operating ratio between an amplitude and a frequency of the AC voltage for the motor connected to the motor drive. Operating at the appropriate ratio for the motor connected to the motor drive prevents the magnetic field within the motor from decreasing to such a degree that the motor is no longer able to produce the torque required by the motor to maintain control of the load and rather allows the motor drive to maintain control of the load even when the voltage present on the DC bus drops.

According to one embodiment of the invention, a method for low DC bus voltage ride through includes receiving a run command and a speed command at a motor drive and generating an output voltage from the motor drive to the motor. The run and speed commands define a desired operation of a motor connected to the motor drive, and the output voltage is generated at an output frequency corresponding to the speed command. A voltage present on a DC bus within the motor drive is measured, and a maximum output frequency from the motor drive is determined as a function of the voltage present on the DC bus. When the maximum output frequency is less than the output frequency corresponding to the speed command, the output frequency is limited to the maximum output frequency.

According to another aspect of the invention, a first threshold may be read from a memory in the motor drive and compared to the maximum output frequency. When the maximum output frequency is less than the both the output frequency corresponding to the speed command and the first threshold, the output frequency may be limited to the maximum output frequency According to still another aspect of the invention, a run sequence may be initiated in the motor drive when the run command is received, and the run sequence may be maintained until the run command is removed from the motor drive. During the run sequence, limiting of the output frequency is tracked and a value of the limited output frequency is maintained as a second maximum output frequency. When either the maximum output frequency or the second maximum output frequency is less than the output frequency corresponding to the speed command, the output frequency is limited to a lesser value of the maximum output frequency and the second maximum output frequency.

According to yet another aspect of the invention, a hysteresis value may be read from a memory in the motor drive. After the output frequency has been limited, the maximum output frequency may be compared to a sum of the limited output frequency plus the hysteresis value. The output frequency may be maintained at the limited output frequency when the maximum output frequency is less than the sum of the limited output frequency plus the hysteresis value, and a new limited output frequency is set to the maximum output frequency when the maximum output frequency is greater than the sum of the limited output frequency plus the hysteresis value.

According to still another aspect of the invention, the step of determining the maximum output frequency from the motor drive may include reading a first value of output frequency and a second value of output frequency from a memory in the motor drive, the first and second values corresponding to a first and second voltage, respectively. The first voltage is greater than the voltage present on the DC bus and the second voltage is less than the voltage present on the DC bus. The motor drive interpolates between the first and second value of output frequency to determine the maximum output frequency corresponding to the voltage present on the DC bus.

According to another embodiment of the invention, a motor drive configured to ride through a low DC bus voltage includes a first input configured to receive a run command, a second input configured to receive a speed command, a DC bus configured to provide a DC voltage to an inverter section within the motor drive, a sensor generating a signal corresponding to the DC voltage present on the DC bus, an inverter section configured to receive the DC voltage from the DC bus and to generate an AC voltage at an output frequency for a motor connected to the motor drive, and a processor. The processor is configured to control the inverter section to generate the AC voltage with the output frequency at the speed command, receive the signal corresponding to the DC voltage present on the DC bus, determine a maximum output frequency from the motor drive as a function of the voltage present on the DC bus and, when the maximum output frequency is less than the output frequency at the speed command, limit the output frequency of the AC voltage to the maximum output frequency. The motor drive may also include a communication interface configured to receive a plurality of data packets, where the first input and the second input are included in at least one of the plurality of data packets.

According to yet another embodiment of the invention. A method for riding through a low DC bus voltage in a hoist system includes receiving a run command and a speed command from a user interface at a motor controller for the hoist system. Rotation of a motor is controlled with the motor controller to raise or lower a hook in the hoist system at the speed command. A voltage present on a DC bus in the motor controller is measured, and a maximum output frequency from the motor controller is determined as a function of the voltage present on the DC bus. When the maximum output frequency is less than an output frequency required to control rotation of the motor to raise or lower the hook at the speed command, the output frequency is limited to the maximum output frequency.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which:

FIG. 1 is a perspective view of an exemplary hoist system incorporating one embodiment of low DC bus voltage ride through;

FIG. 5 is a graphical representation of output frequency limiting according to one embodiment of low DC bus ride through; and FIG. 6 is a flow diagram of one embodiment of low DC bus voltage ride through.

Figure 1:
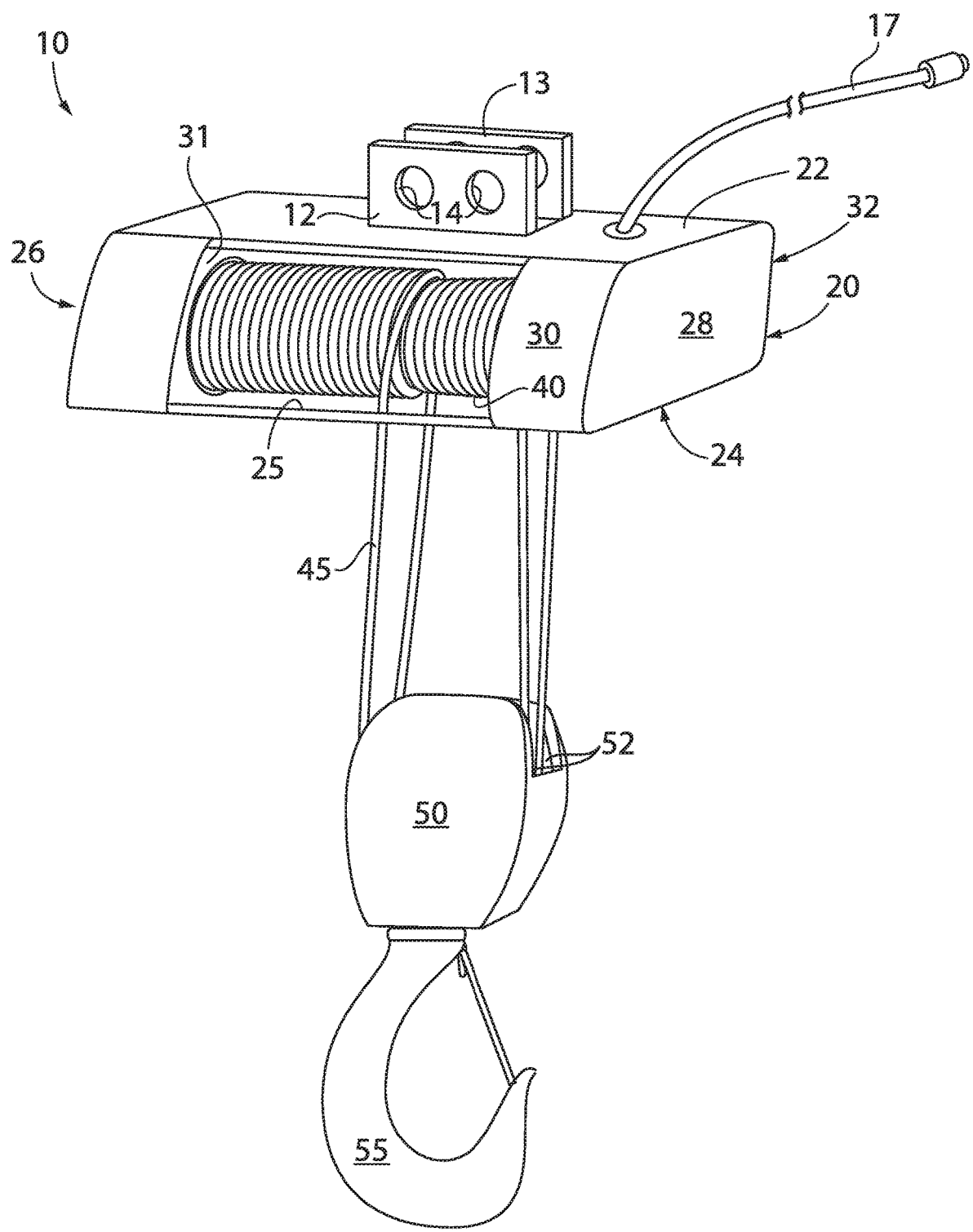

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION OF THE INVENTION

The various features and advantageous details of the subject matter disclosed herein are explained more fully with reference to the non-limiting embodiments described in detail in the following description.

Turning initially to FIG. 1, an exemplary wire-rope hoist system 10 is illustrated. The wire-rope hoist system 10 includes a frame 20 having a top surface 22 and a bottom surface 24, opposite the top surface. The frame 20 further includes a first end 26, a second end 28, a front face 30, and a rear face 32, where each of the first and second ends and each of the front and rear faces extend between the top and bottom surfaces. A first opening 31 is present in the front face 30 through which a drum 40 mounted within the frame 20 is visible. A second opening 25 is present in the bottom surface 24 through which a rope 45 wound around the drum 40 extends. As the drum 40 is rotated either forward or reverse, the rope 45 either winds up around the drum or is spooled out off the drum. The rope 45 passes through a block 50 and over one or more sheaves 52 within the block 50 and back up to the frame 20. As the rope 45 winds up around the drum or is spooled off the drum, a length of the rope 45 varies, causing the block 50 to raise and lower. A hook 55 mounted to the bottom of the block 50 is, in turn, raised and lowered in tandem with the block 50.

A mounting block 12 is fastened to the top surface 22 of the hoist system 10. Holes 14 passing through the mounting block 12 are configured to receive bolts (not shown). A cavity 13 within the mounting block 12 may receive a complementary mounting structure (not shown) connected, for example, to a steel I-beam or to a trolley mounted on the I-beam. The bolts may, for example, be passed through the holes 14 in the mounting block 12 and then through holes in the complementary mounting structure, to rigidly mount the hoist system 10 to the I-beam. The I-beam may be pivotally mounted to a wall, such that the hoist system 10 may be used to raise or lower a load connected to the hook 55 on the block 50 and the I-beam pivoted while the load is suspended to move the load from one location to another. Optionally, the complementary mounting structure may be mounted to rollers, for example, on a trolley which are, in turn, mounted to the I-beam or other track, such that the hoist system 10 may be pushed along the I-beam or other track while a load is suspended by the hoist system 10 to move the load between locations.

The illustrated hoist system 10 is not intended to be limiting. The present invention may be incorporated into hoist systems having numerous configurations or combinations of elements either illustrated in or in addition to those illustrated in FIG. 1 according to the application requirements without deviating from the scope of the invention. For example, the hoist system 10 may be incorporated onto an overhead crane and mounted to a trolley configured to move in an x-y plane via a set of rails and a bridge. The hoist system may be single-reeved or double-reeved. The hoist system may utilize alternate load handling members, such as a vacuum or a lifting clamp. Similarly, the present invention may be incorporated into winch-type applications which may spool out and reel in a cable along a more horizontal plane, including but not limited to a winch, a dredge, an anchor, or other side-pull systems.

The following definitions will be used to describe the exemplary hoist system throughout this specification. As used herein, the terms "raise" and "lower" are intended to denote the operations of letting out or reeling in the rope 45 from the drum 40 and are not limited to moving a load in a vertical plane. The load handling member may be any suitable device for connecting to or grabbing a load, including, but not limited to, a hook 55, a vacuum, a grapple, or a magnet. While an overhead hoist may lift a load vertically, a winch may pull a load from the side. Further, an appropriately configured load handling member may allow a load to unwind cable or may reel in the load by winding up the cable at any desired angle between a horizontal plane and a vertical plane.

The "rope," also known as a "cable," may be of any suitable material. For example, the "rope" may be made from, but is not limited to, steel, nylon, plastic, other metal or synthetic materials, or a combination thereof, and may be in the form of a solid or stranded cable, chain links, or any other combination as is known in the art.

Figure 2:
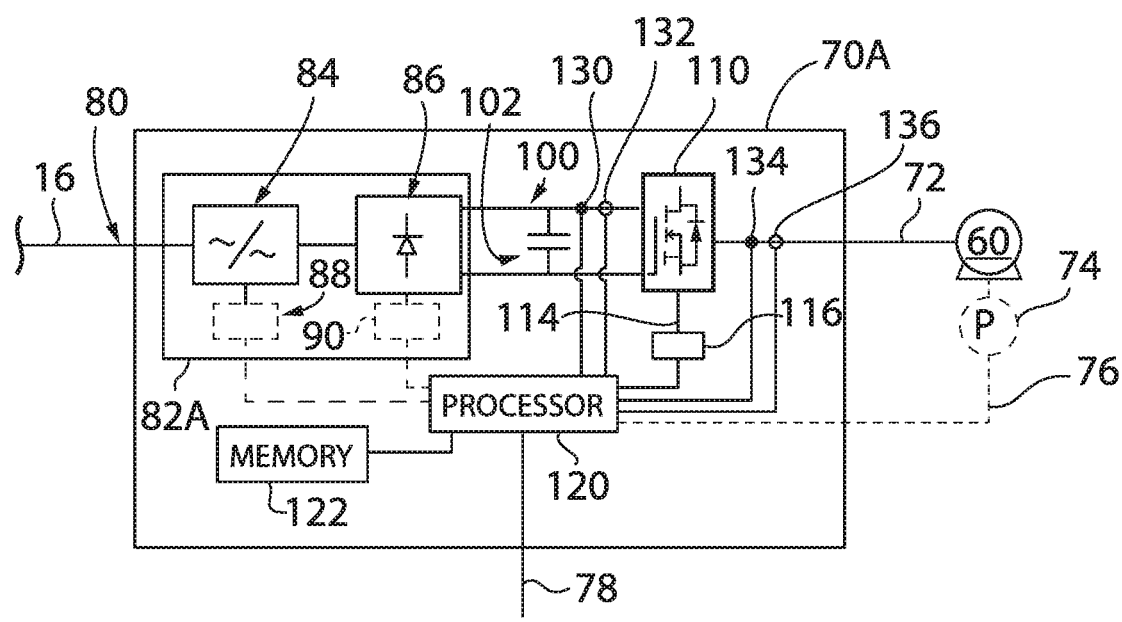
FIG. 2 is a block diagram representation of one embodiment of a motor controller and motor incorporated into the hoist system of FIG. 1.
Figure 3:
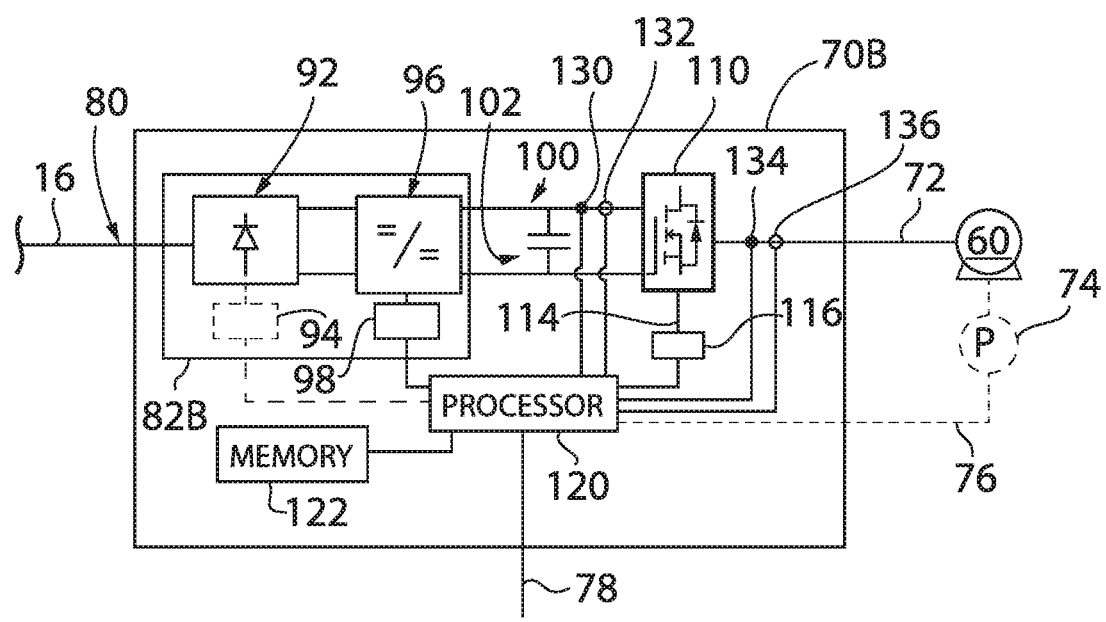
FIG. 3 is a block diagram representation of another embodiment of a motor controller and motor incorporated into the hoist system of FIG. 1

A "run" is one cycle of operation of the motor controller 70 (see also FIGS. 2 and 3). The motor controller 70 controls operation of a motor 60, rotating the motor 60 to cause the rope 45 to wind around or unwind from the drum 40. A "run" may include multiple starts and stops of the motor 60 and, similarly it may require multiple "runs" to let the rope 45 fully unwind or wind completely around the drum 40. Further, the rope 45 need not be fully unwound from or wound around the drum 40 before reversing direction of rotation of the motor 60. In addition, direction of rotation of the motor 60 may be reversed within a single run.

With reference also to FIGS. 2 and 3, a motor 60 is mounted within the frame 20 and is used to control rotation of the drum 40. It is contemplated that the motor 60 may be coupled to the drum 40 via any conventional drive train, such as a gearbox mounted in one end of the frame 20. Optionally, the motor 60 may be integrally formed with the drum 40 or the drum 40 may be directly connected to a rotating member of the motor 60 to form a direct-drive configuration. A motor controller 70 is also mounted within, on, or proximate to the frame 20 and is used to achieve desired operation of the motor 60.

FIG. 2 illustrates a first exemplary motor controller 70A, also referred to herein as a motor drive, used to control operation of the motor 60 within the hoist system 10. The motor controller 70A delivers a regulated voltage and/or current to the motor 60 via a set of electrical conductors 72. The magnitude and frequency of the voltage or current may be varied to control the speed at which the motor 60 rotates, the torque produced by the motor, or a combination thereof. In some applications, it may be desired to include a feedback device 74, such as an encoder or a resolver, connected to the motor 60, typically by mounting the feedback device 74 to the output shaft at one end of the motor 60. The feedback device 74 provides a feedback signal 76, corresponding to rotation of the motor 60, as would be known in the art.

The motor controller 70 receives a command signal 78 from any suitable user interface. The user interface may be, but is not limited to, a keypad mounted on the motor controller 70, a remote industrial joystick with a wired connection to the motor controller 70, a pendant station suspended from the frame 20, a radio receiver connected to the motor controller and receiving a wireless signal from a corresponding radio transmitter, or a wired or wireless network transmitting data packets including the command signal 78. The motor controller 70 includes an input 80, for example, one or more terminals, configured to receive power 16, which may be a single or multiple phase alternating current (AC) or a direct current (DC) power source.

A power conversion section 82 of the motor controller 70 converts the input power 16 to a desired DC voltage for a DC bus 100 within the motor controller. According to the embodiment illustrated in FIG. 2, the power conversion section 82A includes an AC-to-AC converter 86 and a rectifier section 86. It is contemplated that the AC-to-AC converter may be a passive step-up transformer. Optionally, an active power converter may include a control module 88 generating signals for power electronic devices to actively switch the semiconductor devices and to step up the AC voltage from a first amplitude at the input to a second amplitude at the output. The rectifier section 86 may be either passive, such as a diode bridge, or active, including controlled power electronic devices such as transistors and may include an additional control module 90 generating control signals for the power electronic devices in the rectifier section 86. For ease of discussion, the AC-to-AC converter 84 will be discussed herein as a step-up transformer with a primary winding receiving the input voltage 16 at a first amplitude and a secondary winding having an output voltage at a second amplitude. The output voltage from the step-up transformer is supplied as an input to a diode bridge rectifier and converted to the desired DC voltage for the DC bus 100.

According to the embodiment illustrated in FIG. 3, the power conversion section 82B includes a rectifier section 92 and a DC-to-DC converter 96. The rectifier section 92 may be either passive, such as a diode bridge, or active, including controller power electronic devices such as transistors and may include an additional control module 94 generating control signals for the power electronic devices in the rectifier section 92. The rectifier section 92 converts an AC input voltage 16 to a DC voltage at a first amplitude which is, in turn, supplied to the DC-to-DC converter 96. It is contemplated the DC-to-DC converter may be a buck converter, boost converter, or any other suitable converter topology to convert the DC voltage at the input of the converter 96 to a desired DC voltage for the DC bus 100. The DC-to-DC converter includes one or more power electronic devices and a control module 98 to generate control signals to achieve desired operation of the DC-to-DC converter. Although illustrated as being included within the motor controller 70, it is further contemplated that at least a portion of or the entire power conversion section 82 may be mounted external to the motor controller 70 as a separate power supply module. It is further contemplated that at least a portion of or the entire power conversion section may be external to the frame 20 of the hoist system and a DC voltage, output from the power conversion section, may be supplied as the input voltage 16 via a power cable 17 (see FIG. 1) directly to the DC bus 100 of the motor controller. Various other configurations of the power conversion section 82 and motor controller 70 may be utilized without deviating from the scope of the invention.

The input power 16 is converted by the power conversion section 82 to a DC voltage present on the DC bus 100. The DC bus 100 includes a bus capacitance 102 connected across the DC bus 100 to smooth the level of the DC voltage present on the DC bus. As is known in the art, the bus capacitance 102 may include a single, or multiple, capacitors arranged in serial, parallel, or a combination thereof according to the power ratings of the motor controller 70. An inverter section 110 converts the DC voltage on the DC bus 100 to the desired output voltage for the motor 60 according to switching signals 114. A gate module 116 is provided to generate the switching signals to generate an output voltage having the desired amplitude and frequency to control operation of the motor 60. Optionally, the gate module 116 may be integrated with a processor 120 within the motor controller 70.

The motor controller 70 further includes a processor 120 connected to a memory device 122. It is contemplated that the processor 120 may be a single processor or multiple processors operating in tandem. It is further contemplated that the processor 120 may be implemented in part or in whole on a field programmable gate array (FPGA), an application specific integrated circuit (ASIC), a logic: circuit, or a combination thereof. The memory device 122 may be a single device or multiple electronic devices, including static memory, dynamic memory, or a combination thereof. The memory device 122 preferably stores parameters of the motor controller 70 and one or more programs, which include instructions executable on the processor 120. The parameters may, for example, configure operation of the motor controller 70 or store data for later use by the motor controller.

The processor 120 receives feedback signals from sensors corresponding to the present operating conditions within the motor drive 70. A first set of sensors 130, 132 is operatively connected to the DC bus 100. A first DC bus sensor 130 measures the voltage present on the DC bus 100, and a second DC bus sensor 132 measures the current present on the DC bus. A second set of sensors 134, 136 is operatively connected to the output of the motor drive 70. A first output sensor 134 measures the voltage present on one phase of the output, and a second output sensor 136 measures the current present on one phase of the output. If the motor 60 is a multi-phase motor, the motor controller 70 may include a separate voltage sensor 134 and a separate current sensor 136 on each phase of the output to the motor 60.

Figure 4:
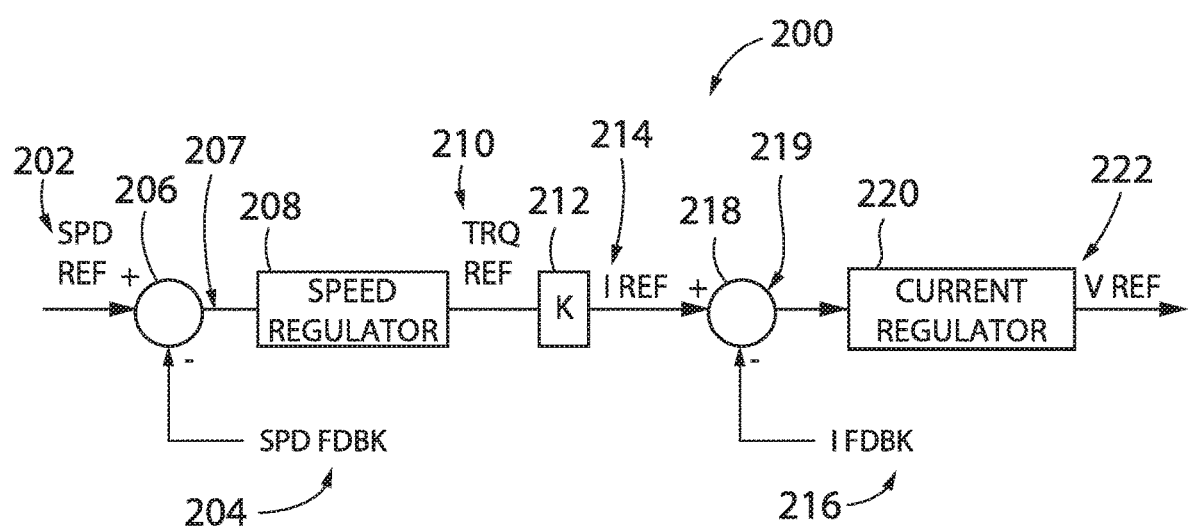
FIG. 4 is a block diagram representation of an exemplary control module executed by the motor controller of FIGS. 2 and 3.

In operation, the processor 120 receives a command signal 78 indicating a desired operation of the corresponding motor 60 in the hoist system 10 and provides a variable amplitude and frequency output voltage to the motor 60 responsive to the command signal 78. With reference to FIGS. 2-4, the command signal 78 is received by the processor 120 and converted, for example, from discrete digital signals or an analog signal to an appropriately scaled speed reference 202 for use by a control module 200 within the motor controller 70. If closed loop operation of the motor drive 70 is desired, the position feedback device 74 is present and providing a position feedback signal 76 to the processor 120. During closed loop operation, the speed reference 202 and a speed feedback signal 204 enter a summing junction 206, resulting in a speed error signal 207. The speed feedback signal 204 may be derived from the position feedback signal 76 generated by the position sensor 74. Optionally, the speed feedback signal 204 may be derived from an internally determined position signal generated, for example, by a position observer. The speed error signal 207 is provided as an input to a speed regulator 208. The speed regulator 208, in turn, determines the required torque reference 210 to minimize the speed error signal 207, thereby causing the motor 60 to run at the desired speed reference 202. If open loop operation of the motor drive 70 is desired, where open loop operation does not include a speed feedback signal, the speed reference signal 202 may be scaled directly to a torque reference 210 that would result in the motor 60 operating at the desired speed reference 202. A scaling factor 212 converts the torque reference 210 to a desired current reference 214. The current reference 214 and a current feedback signal 216, derived from a feedback signal generated by a current sensor 136 measuring the current present at the output of the motor drive 70, enter a second summing junction 218, resulting in a current error signal 219. The current error signal is provided as an input to the current regulator 220. The current regulator 220 generates the voltage reference 222 which will minimize the error signal 219, again causing the motor 60 to run at the desired speed reference 202. This voltage reference 222 is used to generate the switching signals 114 which control the inverter section 110 to produce a variable amplitude and frequency output voltage to the motor 60.

As previously discussed, in certain applications, the hoist system 10 may be connected to a soft power source. In one such application, the hoist system 10 is configured to be connected to a 120 VAC power supply. The power cable 17 may be configured to be hard-wired to a panel or junction box. Optionally, the power cable 17 may have a plug and be configured to be inserted into a complementary receptacle of an outlet. The hoist system 10 may be configured as illustrated in FIG. 2 with a step-up transformer 84 to convert the 120 VAC to 240 VAC as an input to the rectifier section 86. The rectifier section 86 converts the 240 VAC to a nominal 340 VDC voltage on the DC bus 100.

A number of reasons may cause the input power to be a soft power source. For example, the 120 VAC may be supplied by a generator where a total load on the generator exceeds the capacity of the generator and causes the voltage output from the generator to droop. Similarly, the 120 VAC may be supplied by an alternate energy source, such as a wind turbine or photovoltaic array. The variable nature of the alternate energy source may also cause fluctuation in the power source. As still another example, the transformer 84 may be external to the hoist system and be configured to supply 240 VAC to multiple hoists or other loads. If too many loads operate in tandem, the transformer may become saturated and the input voltage to the rectifier section may droop. Regardless of the cause of the soft power source, it is desirable to maintain control of a load connected to the hoist system 10 during periods in which the input power is insufficient to maintain the nominal DC bus voltage and which, in turn, may result in insufficient voltage to achieve desired operation of the motor 60 connected to the motor drive 70.

Figure 5:
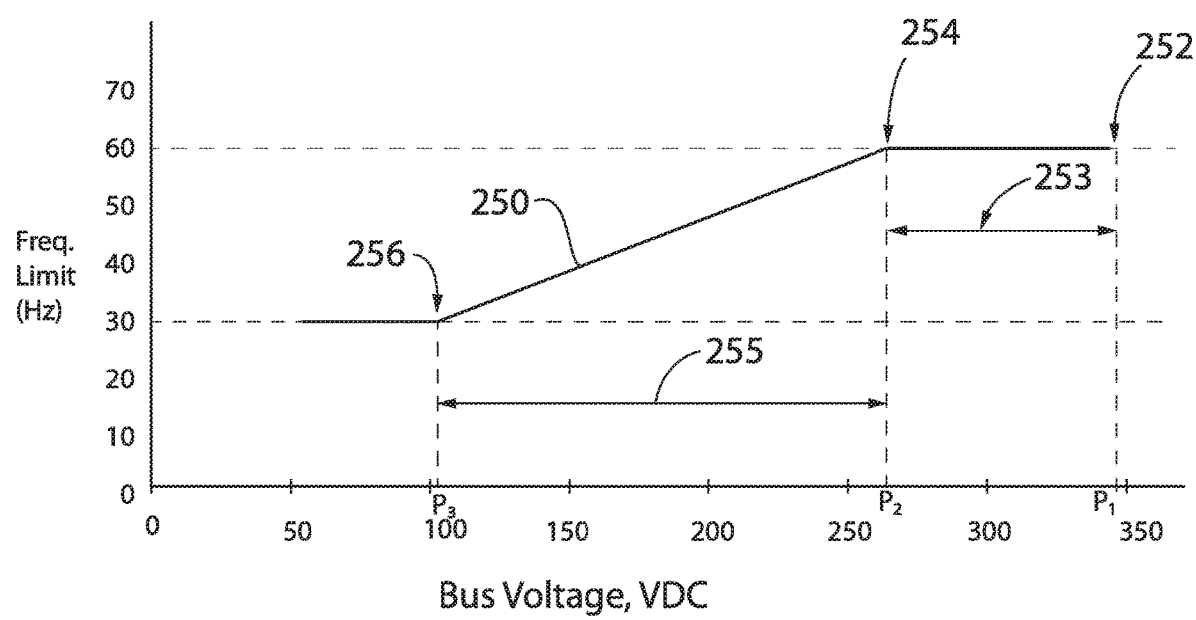

Turning next to FIG. 5, a graphical representation of an output frequency limit utilized by the motor controller 70 to maintain control of the motor 60 during a droop in the DC bus voltage is illustrated. A plot 250 shows the maximum frequency at which the motor 60 will be allowed to operate as a function of the DC voltage measured on the DC bus 100. A first operating point, $P_1$, corresponds to a nominal rated operating point of the motor drive. For the illustrated embodiment, it is contemplated that a 240 VAC voltage is supplied as an input to the rectifier 86 and that a 340 VDC voltage is nominally present on the DC bus 100. Over a first voltage range 253, it is contemplated that some variation in the DC bus voltage may occur without limiting the output frequency of the motor controller 70. Between the first operating point, $P_1$, and a second operating point, $P_2$, the voltage on the DC bus may vary, for example, by about twenty percent (20%) of the rated DC bus voltage and continue to operate at a rated output frequency of 60 Hz.

If however, the voltage level on the DC bus 100 drops below the second operating point, $P_2$, illustrated at about eighty percent (80%) of the rated DC bus voltage, the maximum output frequency is limited. Over a second voltage range 255, the maximum output frequency of the motor drive 70 is limited. The second voltage range 255 spans between the second operating point, $P_2$, and a third operating point, $P_3$. The third operating point corresponds, for example, to a voltage level on the DC bus of about 120 VDC. At this voltage level, the maximum output frequency has been limited to one-half of the rated output frequency or thirty hertz (30 Hz). The illustrated embodiment is intended to be exemplary and not limiting. It is contemplated that the memory 122 in the motor controller 70 may include a number of parameters, or setpoints, stored in memory that define the shape of the plot 250 shown in FIG. 5. A first parameter 252 may define a maximum output frequency at which the motor controller 70 is configured to operate during normal operating conditions. A second parameter 254 may be configured to store a voltage rather than a frequency and may be set to the minimum voltage level for the DC bus 100 at which the motor controller 70 is to be allowed to continue operating at the maximum output frequency (e.g., 60 Hz). A third parameter 256 may similarly be configured to store a voltage and may be set to the minimum voltage level for the DC bus 100 at which the motor controller 70 is to be allowed to continue operating at one-half of the rated output frequency (e.g., 30 Hz). Optionally, the motor controller 70 may include two parameters to define the third operating point, $P_3$, where one of the two parameters define the voltage level corresponding to the third operating point and the other of the two parameters defines the frequency corresponding to the third operating point. The processor 120, executing in the motor controller 70, can read each of the parameters stored in memory 122 and execute instructions to interpolate between the second operating point, $P_2$, and the third operating point, $P_3$, to determine a maximum output frequency at which the motor controller 70 is allowed to operate for a corresponding measured voltage present on the DC bus 100.

Figure 6:
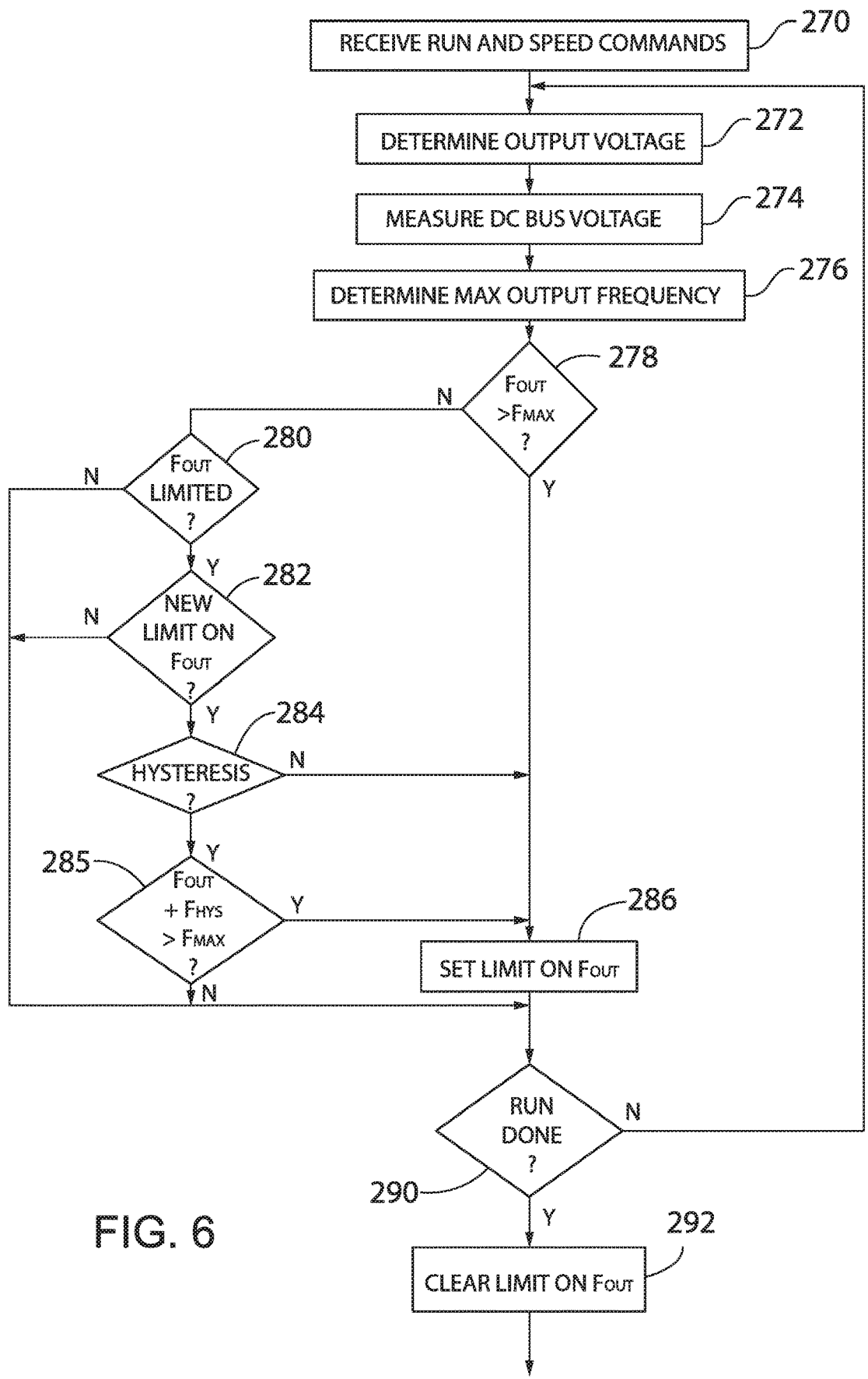

With reference next to FIGS. 1 and 6, the steps executed by the motor drive 70 to ride through a low DC bus voltage according to one embodiment of the invention will be discussed. At step 270, the motor drive 70 receives a run command and a speed command from a user interface. According to one embodiment, the user interface may be a push-button pendant station (not shown) suspended from the frame 20 of the wire-rope hoist system 10. The pendant station may have a first pushbutton corresponding to a run command and one or more additional pushbuttons corresponding to a desired speed of operation. Optionally, the pendant station may include a first pushbutton commanding that the hook 55 be raised and a second pushbutton commanding that the hook 55 be lowered. Each pushbutton may include multiple detent positions, where each detent position indicates a different desired speed at which the hook 55 is to be raised or lowered. It is contemplated that the user interface may take any suitable configuration according to the application requirements.

When a run command is received, the motor drive 70 may initiate a run sequence. The run sequence may include, for example, verifying that no fault condition is present in the motor drive, enabling the motor drive 70 to output a constant voltage to resist initial rotation of the drum 40 due to gravity acting on the hook 55 and/or a load present, releasing a holding brake (if present), and beginning to control operation of the motor 60. It is contemplated that the run sequence may include only a portion of these steps or may include still additional steps according to the application requirements. The run sequence may stay active until the run command is removed at which time the motor drive 70 may bring the hook 55 to a controlled stop or an immediate stop and set the holding brake (if present).

After receiving the run and speed commands and during the run sequence, the motor drive 70 executes the control module 200 (see also FIG. 4) to determine a voltage reference 222, as shown in step 272, to generate an output voltage to the motor 60 (see also FIG. 2) to control operation of the motor 60. The voltage reference 222 includes a desired amplitude and frequency of the output voltage to control rotation of the motor 60 to raise or lower the hook 55 at the received speed command. Throughout the run sequence, the motor drive 70 measures the voltage present on the DC bus 100, as shown in step 274. At step 276, the motor drive 70 then determines a maximum output frequency at which the motor drive 70 may run based on the measured DC bus voltage. The motor drive 70 determines the maximum output frequency according to the output frequency limit shown in FIG. 5 and as discussed above.

At step 278, the motor drive 70 compares the frequency of the output voltage determined in step 272 to the maximum output frequency determined in step 276. If the output frequency is greater than the maximum frequency, the motor drive 70 jumps to step 286 and limits the output frequency to the maximum output frequency. According to one embodiment of the invention, the motor drive 70 implements the limit via a limit block on the speed command 202 received at the control module 200. The speed command may be capped at a maximum value that corresponds to the maximum output frequency. As a result, if the control module 200 is operating in a closed loop manner, the capped speed command may be compared to the speed feedback signal 204 such that the resulting speed error signal 207 does not begin to grow as the output frequency is limited from the original speed command.

According to one aspect of the invention, it is contemplated that the maximum output frequency may remain in place throughout a run sequence. In other words, once the maximum output frequency has been capped, it will not be restored to the original maximum output frequency until the run command has been removed from the motor drive 70 and a new run command is issued. If, however, the maximum output frequency were to continue to drop, as a result of the voltage level on the DC bus continuing to decrease, the maximum output frequency would similarly drop to the lower value and remain at the lower value until the next run sequence is initiated. At step 290, therefore, the motor drive monitors whether a run command is present or if the run sequence is still active in order to determine whether the run is done. If the run is not done, the motor drive 70 may continue to execute steps 272-278 and 286 to continually monitor the voltage present on the DC bus and to limit the output frequency of the voltage supplied to the motor 60 from the motor drive 70 throughout the run. When the run is complete, the motor drive 70 may move to step 292 and clear the limit set on the maximum output frequency during the prior run, restoring the maximum output frequency, for example, to a rated output frequency or to some other frequency as stored in memory 122 of the motor drive.

According to another aspect of the invention, it may be desirable to return the maximum output frequency to a greater value if the voltage level on the DC bus returns to normal or increases above the lowest voltage level measured while a run is active. At step 278, the motor drive 70 may determine whether the maximum output frequency determined at step 276 is greater than the output frequency for the voltage supplied to the motor 60 as determined in step 272. If the output frequency is not greater than the maximum output frequency, the motor drive 70 next determines whether a limit had been applied to the maximum output frequency, as shown in step 280. If the output frequency is not greater than the maximum output frequency and no limit had been applied, then the motor drive 70 is operating normally and execution continues at step 290 without limiting the output frequency of the voltage. If, however, it is observed at step 280 that the output frequency had been limited during the present run and the output frequency is now less than the maximum output frequency, it is possible that the DC bus voltage has returned to its normal level or at least increased above its lowest level and the motor drive 70 may safely output a voltage with an output frequency greater than the present, limited output frequency.

At step 282, it is determined whether a new limit on the output frequency needs to be determined. If, for example, the speed command has been reduced by a user during the run below the maximum output frequency, the motor drive 70 may be able to operate at the reduced frequency, but may still be unable to operate at the original frequency, which caused the output frequency to be limited. Because the motor drive 70 is executing at the desired speed command, there is no new limit required for the output frequency and execution resumes at step 290. If, however, the speed command is still greater than the maximum output frequency and the motor drive had previously limited the output frequency as a result of a reduced DC bus voltage, the motor drive 70 may again determine the maximum output frequency according to the output frequency limit shown in FIG. 5 and as discussed above and set a new limit for the maximum output frequency and continue execution at step 284.

While it may be desirable to allow the motor drive 70 to resume operation at normal speed during a run if there is only a temporary dip in the DC bus voltage rather than waiting until a new run command is received, it may also be desirable to prevent unstable operation that could arise if the motor drive 70 is continually lowering or raising the maximum output frequency responsive to the measured DC bus voltage. Thus, at step 284, the motor drive 70 may determine whether a hysteresis band has been set. If no hysteresis band is set, the motor drive 70 may continually monitor the DC bus voltage and determine a maximum output frequency corresponding to the DC bus voltage. If a hysteresis band is set, the motor drive 70 first requires that a hysteresis frequency be added to the limited value of the output frequency and this sum is, in turn compared to the maximum output frequency, as shown in step 285. For example, if the output frequency had previously been limited from 60 Hz to 30 Hz and a hysteresis band of 5 Hz is set within the motor drive, the motor drive uses the plot of FIG. 5 and based on the measured DC bus voltage requires that the maximum output frequency return to at least 35 Hz before determining a new maximum output frequency. This new maximum output frequency is set in step 286 and the motor drive continues operation until the run is complete, as determined in step 290. If, however, the maximum output frequency, based on the measured DC bus voltage, increases only to 33 Hz, the motor drive 70 would maintain the 30 Hz maximum output frequency and continue operation until the run is complete.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

We claim:

1. A method for low DC bus voltage ride through, the method comprising the steps of:
   (a) receiving a run command at a motor drive, wherein the run command indicates a desired operation of a motor connected to the motor drive;
   (b) receiving a speed command at the motor drive, wherein the speed command further defines the desired operation of the motor connected to the motor drive;
   (c) generating an output voltage from the motor drive to the motor wherein the output voltage has a desired output frequency corresponding to the speed command;
   (d) measuring a voltage present on a DC bus within the motor drive;
   (e) determining a maximum output frequency from the motor drive as a function of the voltage present on the DC bus; and
   (f) when the maximum output frequency determined in step (e) is less than the desired output frequency determined in step (c), limiting an output frequency from the motor drive to the maximum output frequency.

2. The method of claim 1 further comprising the steps of:
   reading a first threshold from a memory in the motor drive;
   comparing the maximum output frequency to the first threshold; and
   limiting the output frequency to the maximum output frequency when the maximum output frequency is less than the desired output frequency corresponding to the speed command and less than the first threshold.

3. The method of claim 1 further comprising the steps of:
   initiating a run sequence in the motor drive when the run command is received;
   maintaining the run sequence until the run command is removed from the motor drive;
   during the run sequence, tracking when the output frequency is limited;
   maintaining a limited output frequency as a second maximum output frequency; and
   when either the maximum output frequency or the second maximum output frequency is less than the desired output frequency corresponding to the speed command, limit the output frequency to a lesser value of the maximum output frequency and the second maximum output frequency.

4. The method of claim 1 further comprising the steps of:
   reading a hysteresis value from a memory in the motor drive; and
   after the output frequency has been limited:
      comparing the maximum output frequency to a sum of the limited output frequency plus the hysteresis value,
      maintaining the output frequency at the limited output frequency when the maximum output frequency is less than the sum of the limited output frequency plus the hysteresis value, and
      setting a new limited output frequency to the maximum output frequency when the maximum output frequency is greater than the sum of the limited output frequency plus the hysteresis value.

5. The method of claim 1 wherein the step of determining the maximum output frequency from the motor drive further comprises the steps of:
   reading a first value of output frequency corresponding to a first voltage from a memory in the motor drive, the first voltage greater than the voltage present on the DC bus;
   reading a second value of output frequency corresponding to a second voltage from the memory, the second voltage less than the voltage present on the DC bus; and
   interpolating between the first and second value of output frequency to determine the maximum output frequency corresponding to the voltage present on the DC bus.

6. A motor drive configured to ride through a low DC bus voltage, the motor drive comprising:
   a first input configured to receive a run command;
   a second input configured to receive a speed command;
   a DC bus configured to provide a DC voltage to an inverter section within the motor drive;
   a sensor generating a signal corresponding to the DC voltage present on the DC bus;
   the inverter section configured to receive the DC voltage from the DC bus and to generate an AC voltage for a motor connected to the motor drive, wherein the AC voltage is generated at an output frequency; and
   a processor configured to:
      control the inverter section to generate the AC voltage with a desired output frequency at the speed command,
      receive the signal corresponding to the DC voltage present on the DC bus;
      determine a maximum output frequency from the motor drive as a function of the voltage present on the DC bus; and
      when the maximum output frequency, which is determined as a function of the voltage present on the DC bus, is less than the desired output frequency for the AC voltage to be generated by the inverter section at the speed command, limit the output frequency of the AC voltage to the maximum output frequency.

7. The motor drive of claim 6 further comprising a communication interface configured to receive a plurality of data packets, wherein the first input and the second input are included in at least one of the plurality of data packets.

8. The motor drive of claim 6 further comprising a memory operative to store a first threshold, the processor further configured to:
   read the first threshold from the memory;
   compare the maximum output frequency to the first threshold; and
   only limit the output frequency of the AC voltage to the maximum output frequency when the maximum output frequency is less than the desired output frequency at the speed command and less than the first threshold.

9. The motor drive of claim 6 wherein the processor is further configured to:
   initiate a run sequence in the motor drive when the run command is received;
   maintain the run sequence until the run command is removed from the motor drive;

during the run sequence, track when the output frequency is limited;
maintain a limited output frequency as a second maximum output frequency; and
when either the maximum output frequency or the second maximum output frequency is less than the desired output frequency at the speed command, limit the output frequency of the AC voltage to a lesser value of the maximum output frequency and the second maximum output frequency.

10. The motor drive of claim 6 further comprising a memory configured to store a hysteresis value, the processor further configured to:
read the hysteresis value from the memory; and
after the output frequency has been limited:
compare the maximum output frequency to a sum of the limited output frequency plus the hysteresis value,
maintain the output frequency at the limited output frequency when the maximum output frequency is less than the sum of the limited output frequency plus the hysteresis value, and
set a new limited output frequency to the maximum output frequency when the maximum output frequency is greater than the sum of the limited output frequency plus the hysteresis value.

11. The motor drive of claim 6 further comprising a memory configured to store a first value of output frequency corresponding to a first voltage and a second value of output frequency corresponding to a second voltage, wherein in order to determine the maximum output frequency from the motor drive, the processor is further configured to:
read the first value of output frequency;
read the second value of output frequency; and
interpolate between the first and second value of output frequency to determine the maximum output frequency corresponding to the voltage present on the DC bus.

12. A method for riding through a low DC bus voltage in a hoist system, the method comprising the steps of:
receiving a run command from a user interface at a motor controller for the hoist system;
receiving a speed command from the user interface at the motor controller;
controlling rotation of a motor with the motor controller to raise or lower a hook in the hoist system at the speed command;
measuring a voltage present on a DC bus in the motor controller;
determining a maximum output frequency from the motor controller as a function of the voltage present on the DC bus; and
when the maximum output frequency is less than a desired output frequency required to control rotation of the motor to raise or lower the hook at the speed command, limit an output frequency to the maximum output frequency.

13. The method of claim 12 further comprising the steps of:
reading a first threshold from a memory in the motor controller;
comparing the maximum output frequency to the first threshold; and
limiting the output frequency to the maximum output frequency when the maximum output frequency is less than the desired output frequency required by the speed command and less than the first threshold.

14. The method of claim 12 further comprising the steps of:
initiating a run sequence in the motor controller when the run command is received;
maintaining the run sequence until the run command is removed;
during the run sequence, tracking when the output frequency is limited;
maintaining a limited output frequency as a second maximum output frequency; and
when either the maximum output frequency or the second maximum output frequency is less than the desired output frequency required by the speed command, limit the output frequency to a lesser value of the maximum output frequency and the second maximum output frequency.

15. The method of claim 12 further comprising the steps of:
reading a hysteresis value from a memory in the motor controller; and
after the output frequency has been limited:
comparing the maximum output frequency to a sum of the limited output frequency plus the hysteresis value,
maintaining the output frequency at the limited output frequency when the maximum output frequency is less than the sum of the limited output frequency plus the hysteresis value, and
setting a new limited output frequency to the maximum output frequency when the maximum output frequency is greater than the sum of the limited output frequency plus the hysteresis value.

16. The method of claim 12 wherein the step of determining the maximum output frequency from the motor controller further comprises the steps of:
reading a first value of output frequency corresponding to a first voltage from a memory in the motor controller, the first voltage greater than the voltage present on the DC bus;
reading a second value of output frequency corresponding to a second voltage from the memory, the second voltage less than the voltage present on the DC bus; and
interpolating between the first and second value of output frequency to determine the maximum output frequency corresponding to the voltage present on the DC bus.

* * * * *